US009677168B2

(12) United States Patent
Baker et al.

(10) Patent No.: US 9,677,168 B2
(45) Date of Patent: Jun. 13, 2017

(54) TOUCH PANEL AND METHOD FOR MANUFACTURING THE SAME

(71) Applicant: TPK America, LLC, Dover, DE (US)

(72) Inventors: Brain Baker, Hamilton, MI (US); Mondher Cherif, Evanston, IL (US); Ed Sasamoto, Holland, MI (US)

(73) Assignee: TPK America, LLC, Dover, DE (US)

( * ) Notice: Subject to any disclaimer, the term of this patent is extended or adjusted under 35 U.S.C. 154(b) by 72 days.

(21) Appl. No.: 14/048,059

(22) Filed: Oct. 8, 2013

(65) Prior Publication Data

US 2015/0099101 A1    Apr. 9, 2015

(51) Int. Cl.
C23C 14/35 (2006.01)
C23C 14/08 (2006.01)
C23C 14/58 (2006.01)
C23C 16/02 (2006.01)
C23C 16/40 (2006.01)
G06F 3/041 (2006.01)
C23C 14/34 (2006.01)

(52) U.S. Cl.
CPC ........ *C23C 14/086* (2013.01); *C23C 14/3485* (2013.01); *C23C 14/35* (2013.01); *C23C 14/5873* (2013.01); *C23C 16/0281* (2013.01); *C23C 16/407* (2013.01); *G06F 3/0414* (2013.01); *B32B 2457/208* (2013.01); *Y10T 428/24851* (2015.01)

(58) Field of Classification Search
CPC ............ G06F 3/0414; B32B 2457/208; C23C 16/0281; C23C 16/407; C23C 14/086; C23C 14/35; C23C 14/5873; C23C 14/3485
See application file for complete search history.

(56) References Cited

U.S. PATENT DOCUMENTS

| 2002/0047962 | A1* | 4/2002 | Tanaka et al. | 349/110 |
| 2008/0042996 | A1* | 2/2008 | Endo et al. | 345/176 |
| 2008/0318018 | A1* | 12/2008 | Segawa | G02B 5/003 428/220 |
| 2009/0111216 | A1 | 4/2009 | Weichart et al. | |
| 2010/0006426 | A1 | 1/2010 | Sittinger et al. | |
| 2010/0026659 | A1* | 2/2010 | Long et al. | 345/174 |
| 2010/0183900 | A1* | 7/2010 | Wallin et al. | 428/698 |
| 2011/0005920 | A1 | 1/2011 | Ivanov et al. | |
| 2011/0180389 | A1 | 7/2011 | Cremer et al. | |
| 2013/0043121 | A1* | 2/2013 | Anders | 204/192.12 |

FOREIGN PATENT DOCUMENTS

| CN | 102108492 A | 6/2011 |
| TW | M371271 U | 12/2009 |
| TW | 201012959 A | 4/2010 |
| TW | M397551 U | 2/2011 |

* cited by examiner

*Primary Examiner* — Jason M Berman
(74) *Attorney, Agent, or Firm* — Cooper Legal Group, LLC

(57) ABSTRACT

A touch panel includes a first substrate; a mask layer formed on the first substrate, and on a marginal region thereof; a first high density conductive layer covering the mask layer and the first substrate. An adaptive method for manufacturing the touch panel incorporating a HiPIMS-assisted-DC sputtering process is provided as well.

18 Claims, 3 Drawing Sheets

TOUCH PANEL AND METHOD FOR MANUFACTURING THE SAME

FIELD OF THE DISCLOSURE

The present disclosure generally relates to a touch panel and a method for manufacturing the touch panel.

DESCRIPTION OF THE RELATED ART

Touch panels are popular input devices. When the user touches a certain position on the touch panel, corresponding to the text or the images on the underneath display device, the touch panel senses the tactile signals and transmits the tactile signals to a controller for further signal processing. The controller processes the tactile signals and outputs position signals corresponding to the touched position. There are several types of touch panels, for example, resistive types, capacitive types, infrared types, surface acoustic wave types, etc. For instance, the capacitive touch panels detect the difference of capacitance of the touch panel. When the user touches the touch panel, the capacitance of the capacitor on the corresponding position is changed. The controller detects and calculates the difference of capacitance and then outputs corresponding signals.

Usually, a touch panel includes one or more layers, including sensing layers and substrates. Sometimes a touch panel may include a protective substrate providing anti-scratch, anti-glare, and/or anti-reflective function. The sensing layer is generally made of transparent conductive material forming a plurality of patterns. The sensing layer could sense the tactile signal. The tactile signals are transmitted through electrodes distributed on the edge of the sensing layer, therefore, a special mask for shielding the electrodes and improve the visual effects of the touch panel is required. Some touch panels may include a "black mask" for shielding the electrodes. However, the black masks may require a dielectric layer to be electrically isolated from and to mechanically support the sensing layer, for avoiding conductivity shift of the sensing layer in any following manufacture processes in high temperatures. The dielectric layer would therefore make the structure of the touch panel complex, while making the touch panel thick.

SUMMARY OF THE DISCLOSURE

It is provided by the present disclosure a touch panel, the touch panel includes:
  a first substrate;
  a mask layer formed on the first substrate and on a marginal region thereof; and
  a first high density conductive layer covering the mask layer and the first substrate.
  Optionally, the touch panel further comprising:
  a plurality of first electrodes on a side of the first high density conductive layer opposite to the first substrate;
  a second substrate;
  a second conductive layer on the second substrate; and
  a plurality of second electrodes on a side of the second conductive layer opposite to the second substrate.
  Optionally, wherein the touch panel further comprises a transparent adhesive layer between the first high density conductive layer and the second conductive layer.
  Optionally, wherein the mask layer, the first electrodes and the second electrodes are distributed at the marginal region.
  Optionally, wherein the material for the first high density conductive layer is selected from a group consisting of indium tin oxide, indium zinc oxide, and aluminum zinc oxide.
  Optionally, wherein the first high density conductive layer is formed by a HiPIMS-assisted-DC sputtering process.
  Optionally, wherein a sputtering voltage of the sputtering process is between 450V and 1000V, a sputtering power of sputtering process is between 5 kW and 10 kW, a power impulse interval of sputtering process is between 350 µs and 1500 µs, a time for the power impulses of sputtering process is 10 µs to 200 µs, gas flow rate of the sputtering process is between 500 sccms and 1500 sccms, and the pressure of the sputtering process is between 0.002 Torr and 0.010 Torr.

It is provided by the present disclosure a method for manufacturing a touch panel comprising:
  forming a mask layer on a marginal region of a first substrate;
  forming a first high density conductive layer to cover the mask layer and the first substrate; and
  forming a plurality of first electrodes on a side of the first conductive layer opposite to the first substrate.
  Optionally, wherein the mask layer is formed by screen printing or photo-lithographing.
  Optionally, the method further comprising:
  forming a second conductive layer on a second substrate;
  forming a plurality of second electrodes on a side of the second conductive layer opposite to the second substrate; and
  forming a transparent adhesive layer between the first high density conductive layer and the second conductive layer.
  Optionally, wherein the material for the transparent adhesive layer is OCA glue or LOCA glue.
  Optionally, wherein the material for the second conductive layer is selected from a group consisting of indium tin oxide, indium zinc oxide, and aluminum zinc oxide.
  Optionally, wherein the material for the first high density conductive layer is selected from a group consisting of indium tin oxide, indium zinc oxide, and aluminum zinc oxide.
  Optionally, wherein the first high density conductive layer is formed by a magnetron DC sputter machine with a HiPIMS power supply unit.
  Optionally, wherein the first high density conductive layer is formed by a HiPIMS-assisted-DC sputtering process.
  Optionally, wherein a sputtering voltage of the sputtering process is between 450V and 1000V, and a sputtering power of the sputtering process is between 5 kW and 10 kW.
  Optionally, wherein a power impulse interval of the sputtering process is between 350 µs and 1500 µs, and a time for the power impulses of the sputtering process is 10 µs to 200 µs.
  Optionally, wherein a gas flow rate of the sputtering process is between 500 sccms and 1500 sccms, and a pressure of the sputtering process is between 0.002 Torr and 0.010 Torr.
  Optionally, further comprising: patterning the first high density conductive layer.
  Optionally, wherein the first high density conductive layer is patterned by photo-etching.

The touch panel as described above is advantageous for having a simple structure, therefore could reduce the complexity for manufacturing and the cost thereof. The adaptive manufacturing method for the touch panel can increase the conductivity stability of the conductive layers.

BRIEF DESCRIPTION OF DRAWINGS

The above and other objects, characters and advantages of the present disclosure would be clearer through reference of the figures. Among the figures, same marks refer to the same parts. It is not intended to draw the figures by zooming in or out of the actual size while focusing on illustrating the principle of the present disclosure.

DETAILED DESCRIPTION OF THE EMBODIMENTS

In order to make the above and other objects, characters and advantages of the present disclosure clearer and easier to understand, the embodiments of the present disclosure is described hereinafter in combination with the figures.

The disclosure hereinafter provides multiple embodiments or examples for the different structures of the present disclosure. For simplifying the disclosure thereof, components and settings of the particular embodiments would be described below. It could be clear that, such descriptions are only examples, and it is not a purpose to limit the present disclosure. Besides, numeral marks and letters could be repeated in different embodiments of the present disclosure. Such repetition is for simplification and clear purpose, and shall not refer to the relationship of the embodiments and/or the settings. Moreover, the present disclosure provides examples for various particular processes and material, those skilled in the art shall have consciousness of the applicability of the other process and/or material.

Figure 1:
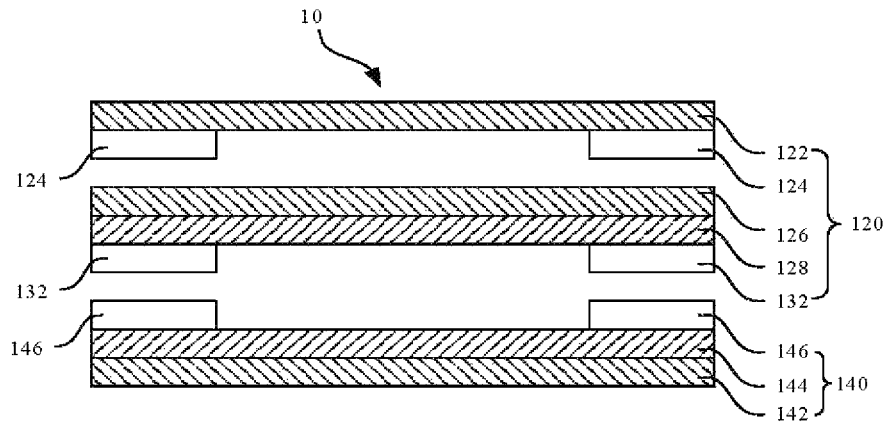
FIG. 1 shows a sectional structure of a touch panel.

Structures have been developed in order to reduce the complexity of the touch panel. Referring to FIG. 1, a touch panel 10 includes a top module 120 and a bottom module 140. In assembly, the top module 120 and the bottom module 140 are bonded together to cooperatively form the touch panel 10. The top module 120 includes a cover substrate 122, a mask layer 124, a first substrate 126, a first conductive layer 128, and first electrodes 132. The bottom module 140 includes a second substrate 142, a second conductive layer 144 and second electrodes 146.

Exemplarily, the material of the cover substrate 122 could be soda lime glass, chemically strengthened soda lime glass. The cover substrate 122 may be clear or have any necessary patterned figures printed or etched thereon, depending on the actual usage for the touch panel. The mask layer 124 is formed on a side of the cover substrate 122, and on a marginal region thereof. Materials for the mask layer 124 could be chosen from various materials, for example, polymer materials. The mask layer 124 may be formed by printing or photolithography. The process for printing or photo-lithographing the mask layer 124 could be found in the conventional documents and would not be described here.

The material for the first substrate 126 could be soda lime glass, chemically strengthened soda lime glass. Accordingly, the first conductive layer 128 is formed on one side of the first substrate 126. Preferably, the first conductive layer 128 is a particular kind of doped conductive oxide, for example, indium tin oxide (ITO) which is mainly indium oxide like $In_2O_3$ doped with tin oxide like $SnO_2$, the doping ratio could be determined by the required transmittance and sheet resistance, for example 90 to 10. In the current embodiment, the first conductive layer 128 could be formed by a sputtering process. Generally, the sputtering process triggers atoms to be ejected from a solid target material due to bombardment of the target by energetic particles, and deposit the atoms on the substrate to form a film layer. Particular annealing process could be made after the deposition if necessary, for enhancing the mechanical and physical performance of the film layer.

The first electrodes 132 are formed on the reverse side of the first conductive layer 128 opposite to the first substrate 126, and on a marginal region of the first conductive layer 128 with respect to the mask layer 124. Generally, in use, the mask layer 124 could be used to cover and shield the first electrodes 132.

Referring to the bottom module 140, the material for the second substrate 142 could be soda lime glass, chemically strengthened soda lime glass. Accordingly, the second conductive layer 144 is formed on one side of the second substrate 142. Preferably, the second conductive layer 144 is indium tin oxide (ITO), while the composition of the indium tin oxide could be a composition of 90% $In_2O_3$ and 10% $SnO_2$. Similarly, the second conductive layer 144 could be formed by a sputtering process, as described above.

The second electrodes 146 are formed on the reverse side of the second conductive layer 144 opposite to the second substrate 142, and on a marginal region of the second conductive layer 144 with respect to the mask layer 124 and the first electrode 132. Therefore, the mask layer 124 could be able to cover and shield the first electrodes 132 and the second electrodes 146 while in use.

According to one aspect, transparent materials could be filled between the cover substrate 122 and the first substrate 126, and between the first conductive layer 128 and the second conductive layer 144, while bonding the top module 120 and the bottom module 140 together to be the touch panel.

According to another aspect, the space between the first conductive layer 128 and the second conductive layer 144 could be designed as vacuum, therefore when there is a touch action on the touch panel 10, the first conductive layer 128 and the second conductive layer 144 could be forced to bend, and contact each other. Accordingly, the contact of the conductive layers could trigger particular signals reflecting the coordinate and the action of the touch action.

Figure 2:
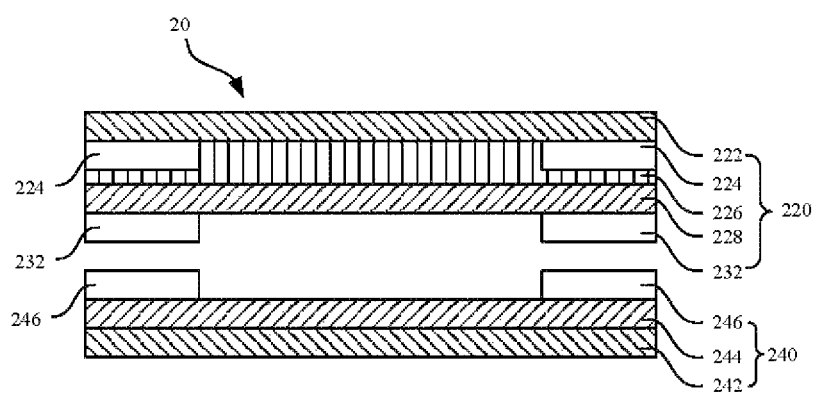
FIG. 2 shows a sectional structure of another touch panel.

Referring to FIG. 2, a touch panel 20 includes also a top module 220 and a bottom module 240. The top module 220 includes a first substrate 222, a mask layer 224, a dielectric layer 226, a first conductive layer 228, and first electrodes 232.

The material for the first substrate 222 could be soda lime glass, chemically strengthened soda lime glass. The mask layer 224 is formed on one side of the first substrate 222, and on a marginal region thereof. The mask layer 224 could be formed by printing or photolithography. The process for printing or photo-lithographing the mask layer 224 could be found in the conventional documents and would not be described here.

The dielectric layer 226 is formed on the first substrate 222, and covering the mask layer 224. The material for the dielectric layer 226 could be of polymer materials with high transmittance. Preferably, the thickness for the dielectric layer 226 could between 10 nm to 500 μm, depending on the actual usage requirement.

The first conductive layer 228 is located at one side of the dielectric layer 226 opposite to the first substrate 222. Preferably, the first conductive layer 228 is a particular kind of doped conductive oxide, for example, indium tin oxide (ITO) which is mainly indium oxide like $In_2O_3$ doped with tin oxide like $SnO_2$, the doping ratio could be determined by the required transmittance and sheet resistance, for example 90 to 10. In the current embodiment, the first conductive layer 128 could be formed by a sputtering process. Generally, the sputtering process triggers atoms to be ejected from a solid target material due to bombardment of the target by energetic particles, and deposit the atoms on the substrate to form a film layer. Particular annealing process could be made after the deposition if necessary, for enhancing the mechanical and physical performance of the film layer.

The first electrodes 232 are formed on the side of the first conductive layer 228 opposite to the dielectric layer 226, and on a marginal region of the first conductive layer 228 with respect to the mask layer 224. Generally, in use, the mask layer 224 could be used for shielding the first electrodes 232.

The bottom module includes a second substrate 242, a second conductive layer 244, and second electrodes 246. The bottom module 240 of FIG. 2 has a similar structure to that of the bottom module 140 according to FIG. 1.

According to one aspect, transparent materials could be filled between the first conductive layer 228 and the second conductive layer 244, while bonding the top module 220 and the bottom module 240 together to be the touch panel.

According to another aspect, the space between the first conductive layer 228 and the second conductive layer 244 could be designed as vacuum, therefore when there is a touch action on the touch panel 20, the first conductive layer 228 and the second conductive layer 244 could be forced to bend, and contact each other. Accordingly, the contact of the conductive layers could trigger particular signals reflecting the coordinate and the action of the touch action.

The touch panel of FIG. 2 includes a thin dielectric layer 226 for incorporating the mask layer 224 to shield the electrodes; therefore does not require a cover substrate as illustrated in FIG. 1. The dielectric layer 226 may require an additional manufacturing step and extra cost in the fabrication of the touch panel.

Figure 3:
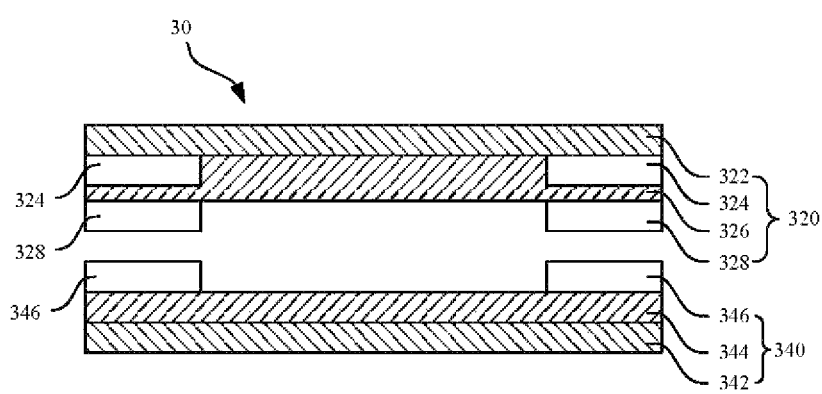
FIG. 3 shows a sectional structure of still another touch panel.

Referring to FIG. 3, a simpler structure of a touch panel 30 is illustrated. The touch panel 30 includes a top module 320 and a bottom module 340. The top module 320 includes a first substrate 322, a mask layer 324, a first high density conductive layer 326, and first electrodes 328. The bottom module 340 includes a second substrate 342, a second conductive layer 344, and second electrodes 346.

Similar to the first substrates and mask layers in FIG. 1 and FIG. 2, the material for the first substrate 322 could be soda lime glass, chemically strengthened soda lime glass. The mask layer 324 is formed on one side of the first substrate 322, and on a marginal region thereof. The mask layer 324 could be formed by printing or photolithography. The process for printing or photo-lithographing the mask layer 324 could be found in the conventional documents and would not be described here.

The first high density conductive layer 326 is located at one side of the first substrate 322. The first conductive layer 326 is distributed over the first substrate 322 and the mask layer 324, and covers the mask layer 324. In an exemplary embodiment, the material for the first high density conductive layer 326 is a particular kind of doped conductive oxide, for example, indium tin oxide (ITO) which is mainly indium oxide like $In_2O_3$ doped with tin oxide like $SnO_2$, the doping ratio could be determined by the required transmittance and sheet resistance, for example 90 to 10. In other embodiments, the proportion may have a bias of 5%. The density of the first high density conductive layer 326 would be higher than conductive layers that are formed by traditional PVD sputtering processes. The first high density conductive layer 326 could be formed by a sputtering process, for example, a high-power impulse magnetron sputtering (HiPIMS, also known as high-power pulsed magnetron sputtering, HPPMS) process. The HiPIMS process may have advantages in surface roughness of the generated film over the DC sputtering process, which promotes results in the conductivity performance of the first high density conductive layer 326.

The first electrodes 328 are formed on the side of the first conductive layer 326 opposite to the first substrate 322, and on a marginal region of the first conductive layer 326 with respect to the mask layer 324. Generally, in use, the mask layer 324 could be used for shielding the first electrodes 328. The first electrodes 328 are used for transmitting signals from the first conductive layer 326 triggered by external touch actions. In one of the exemplary embodiment, the first electrodes 328 could be formed by printing and photo-lithographing or etching conductive materials on the first conductive layer 326.

The second substrate 342 of the bottom module 340 may have a similar structure and material to that of the first substrate 322 of the top module 320; the second conductive layer 344 of the bottom module 340 may have a similar structure and material to that of the first high density conductive layer 326 of the top module 320; and the second electrodes 346 of the bottom module 340 may have a similar structure and material to that of the first electrodes 328 of the top module 320. The second conductive layer 344 of the bottom module 340 could also be formed as high density conductive layer, as similar to the first high density conductive layer 326 of the top module 320. The top module 320 and the bottom module 340 could be bonded through a transparent adhesive layer, for example as made of materials like OCA glue or LOCA glue. That is, the transparent adhesive layer is disposed between the first high density conductive layer 326 and the second conductive layer 344.

The touch panel 30 of FIG. 3 has a simpler structure than the touch panels as illustrated in FIG. 1 and FIG. 2, and requires less process steps, which simplifies the manufacturing and reduces the cost.

Figure 4:
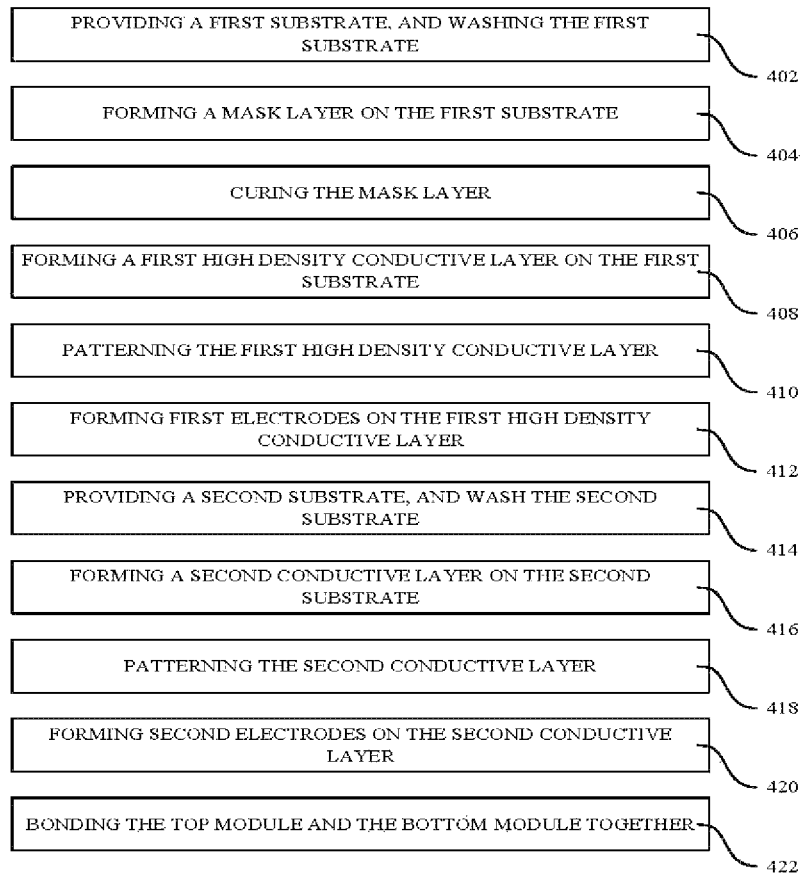
FIG. 4 shows a method for manufacturing the touch panel of FIG. 3.
Figure 5:
FIGS. 5 to 11 are illustrations of the sectional structure of the touch panel of FIG. 3 in each step of the method of FIG. 4.
Figure 6:
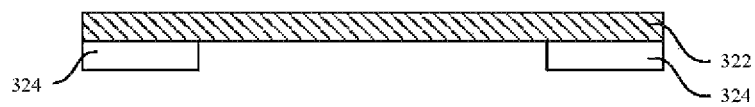

Referring to FIG. 4, a method for manufacturing the touch panel 30 of FIG. 3 is illustrated. For clearer understanding, the method would be described jointly with FIG. 5 through FIG. 13.

Step 402, providing a first substrate 322, and wash the first substrate 322 to facilitate the following steps. Also referring to FIG. 5, the first substrate 322 could be of a rigid material, like soda lime glass, chemically strengthened soda lime glass. Washing the first substrate 322 is for better contact and adhesion with the mask layer 324 and the first high density conductive layer 326.

Step 404, forming a mask layer 324 on the first substrate 322. With reference of FIG. 6, the step of forming the mask layer 324 could be a particular kind of screen printing or other photo-lithographing process that could generate an adhesive contact between the mask layer 324 and the first substrate 322 on its marginal region thereof.

Step 406, curing the mask layer 324. The curing of the mask layer 324 is for making the mask layer more wearable, and generating a more stable adhesion between the mask layer 324 and first substrate 322. Preferably, the curing of the mask layer 324 could be carried by ionizing radiation.

Figure 7:
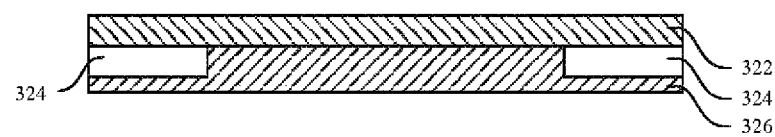

Step 408, forming the first high density conductive layer 326 on the first substrate 322, and covering the mask layer 324 and the first substrate 322. Referring to FIG. 7, in one of the embodiments, the material for the first high density conductive layer 326 is ITO, and, is formed by a HiPIMS-assisted-DC sputtering process. The equipment for the sputtering process could be chosen as a magnetron DC sputter machine with a HiPIMS power supply unit. The sputtering voltage is set between 450V and 1000V; the power is set between 5 kW and 10 kW. As to the power impulse, the impulse interval is set between 350 μs and 1500 μs, and the time for each impulse may be 10 μs to 200 μs. During the sputtering process, the gas flow rate is set between 500 sccms and 1500 sccms; while the pressure thereof is set between 0.002 Torr and 0.010 Torr, keeping in accordance with the gas flow thereof. The temperature of the first substrate 322 is set as 230 degree centigrade. According to experiments, the surface of the sputtered film by using the current sputtering process is less rough than that using the DC sputtering process. Moreover, experiments have shown that after a 24-hour-experiment in the temperature of up to 230 degrees centigrade, the difference between a sheet resistance of the first high density conductive layer 326 over the mask layer 324 and that over the first substrate 322 is less than 15%, which means a high conductivity stability of the first high density conductive layer 326.

Referring to Table 1, according to a 240-hour test of the sheet resistance of the first high density conductive layer 326, it could be found that under various environments, there are minor changes of the sheet resistance of the first high density conductive layer 326 after the environmental test, which means a high stability of the first high density conductive layer 326.

the wash of the second substrate 342 are similar to that of the first substrate 322 and step 402, and would not be described here.

Step 416, forming a second conductive layer 344 on the second substrate 342. Also referring to FIG. 10, the material and the forming of the second conductive layer 344 could be similar to that of the first high density conductive layer 326 and step 408, and would not be described here. In other embodiments, the second conductive layer 344 could also be of other materials and formed by other processes.

Step 418, patterning the second conductive layer 344. The patterning process of the second conductive layer 344 could be similar to that of the first high density conductive layer 326 and step 410, and would not be described here.

Figure 11:
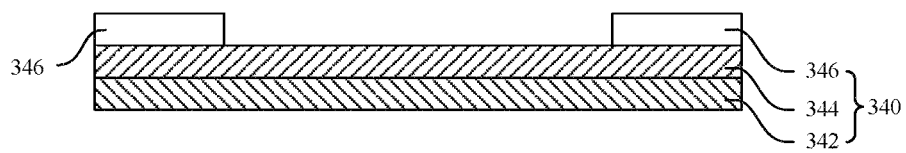

Step 420, forming the second electrodes 346 on the second conductive layer 344. Referring to FIG. 11, the material and the forming of the second electrodes 346 is similar to that of the first electrodes 328 and step 412, and would not be described here. The mask layer 324, the first electrodes 328 and the second electrodes 346 are designed to be distributed at the same marginal position of the touch panel so that the mask layer 324 could be able to shield the first electrodes 328 and the second electrodes 346.

For facility and efficiency, the processes for manufacturing the top module 320 (steps 402 through 412) and the bottom module 340 (steps 414 through 420) could be exchanged or carried simultaneously.

Step 422, bonding the top module 320 with the bottom module 340 together. The top module 320 and the bottom module 340 could be bonded through a transparent adhesive layer, i.e. made of OCA glue or LOCA glue, therefore forming the touch panel 30 as shown in FIG. 3.

It shall be noted that the indium tin oxide as described above shall be one of the examples of the first conductive layer and/or the second conductive layer. Other materials

TABLE 1

| Sample Description | Environmental Test (60/95 RH) for 240 hours | | | | Initial | | After | | % Change | |
|---|---|---|---|---|---|---|---|---|---|---|
| | Setting | O2 | Temp | Time | % T | Res (o/s) | % T | Res (o/s) | % T | Res (o/s) |
| BM samples | LLV | 2.2 | 230 | 55 | 88.9 | 91 | 88.9 | 91 | 0.0% | 0.0% |
| BM samples | LV | 2.2 | 230 | 45 | 87.1 | 75 | 87.3 | 74 | 0.2% | −1.3% |
| BM samples | LV | | 230 | 27 | 90.4 | 150 | 90.4 | 149 | 0.0% | −0.7% |
| BM samples | LV | | | 40 | 88.3 | 88 | 88.2 | 90 | −0.1% | 2.3% |
| BM samples | LV | 2.2 | 230 | 50 | 86.4 | 67 | 86.7 | 69 | 0.3% | 3.0% |

Step 410, patterning the first high density conductive layer 326. For positioning the touch action, the sputtered film shall be patterned in order to, generate the signal triggered by the touch action corresponding to the coordinate on the first high density conductive layer 326 that the touch action is sensed. The patterned films are respectively led out by the first electrodes 328. In the current example, the first high density conductive layer 326 is patterned through a photo-etching process.

Figure 8:
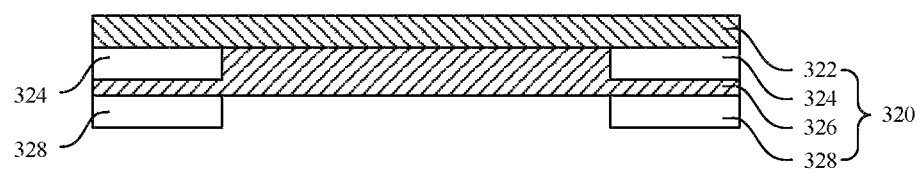

Step 412, forming the first electrodes 328 on the first high density conductive layer 326. Referring to FIG. 8, as an example, the first electrodes 328 could be formed by screen printing process. The mask layer 324, the first electrodes 328 are designed to be distributed at the same marginal position of the touch panel so that the mask layer 324 could be able to shield the first electrodes 328.

Figure 9:
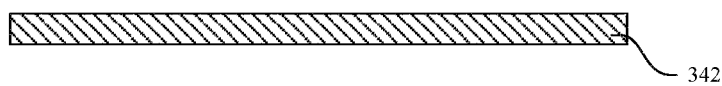
Figure 10:
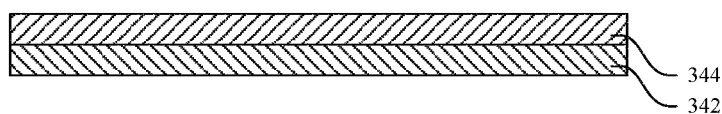

Step 414, providing a second substrate 342 and wash the second substrate 342. Referring to FIG. 9, the material and such as aluminum zinc oxide (AZO) or indium zinc oxide (IZO) could also be used as an example for the current disclosure.

The touch panel as described above is advantageous for having a simple structure, therefore could reduce the complexity for manufacturing and the cost thereof. The adaptive manufacturing method for the touch panel can increase the conductivity stability of the conductive layers.

Although the present disclosure has been described through the preferred embodiment as above, they are not for limiting the present disclosure. Any people in the present technical field could make possible changes and modifications according the method and technical content as above, while being not departing from the spirit and scope of the present disclosure. Therefore, any modification, equivalence and changes in accordance with the technical substance of the present disclosure, not being departed from the technical solutions of the present disclosure, are included in the scope of claims of the present disclosure.

What is claimed is:

1. A method for manufacturing a touch panel comprising:
   forming a mask layer on a marginal region of a first substrate;
   forming a first high density conductive layer by a HiPIMS-assisted-DC sputtering process to cover the mask layer and the first substrate, wherein:
   a power impulse interval of the HiPIMS-assisted-DC sputtering process is between 350 µs and 1500 µs, and
   a temperature of the first substrate is set as 230 degree centigrade when forming the first high density conductive layer by the HiPIMS-assisted-DC sputtering process; and
   forming a plurality of first electrodes connected to the first high density conductive layer.

2. The method of claim 1, wherein the mask layer is formed by screen printing or photo-lithographing.

3. The method of claim 1, further comprising:
   forming a second conductive layer on a second substrate;
   forming a plurality of second electrodes connected to the second conductive layer; and
   forming a transparent adhesive layer between the first high density conductive layer and the second conductive layer.

4. The method of claim 3, wherein a material of the transparent adhesive layer is OCA glue or LOCA glue.

5. The method of claim 3, wherein a material of the second conductive layer comprises indium tin oxide, indium zinc oxide or aluminum zinc oxide.

6. The method of claim 1, wherein a material of the first high density conductive layer comprises indium tin oxide, indium zinc oxide or aluminum zinc oxide.

7. The method of claim 3, wherein forming the second conductive layer comprises forming the second conductive layer by the HiPIMS-assisted-DC sputtering process.

8. The method of claim 1, wherein a sputtering voltage of the HiPIMS-assisted-DC sputtering process is between 450V and 1000V, and a sputtering power of the HiPIMS-assisted-DC sputtering process is between 5 kW and 10 kW.

9. The method of claim 1, wherein a time of a power impulse of the HiPIMS-assisted-DC sputtering process is 10 µs to 200 µs.

10. The method of claim 1, wherein a gas flow rate of the HiPIMS-assisted-DC sputtering process is between 500 sccms and 1500 sccms, and a pressure of the HiPIMS-assisted-DC sputtering process is between 0.002 Torr and 0.010 Torr.

11. The method of claim 3, further comprising:
    patterning the first high density conductive layer; and
    patterning the second conductive layer.

12. The method of claim 1, further comprising curing the mask layer by an ionizing radiation process.

13. A method for manufacturing a touch panel comprising:
    forming a first module of the touch panel, comprising:
      forming a mask layer of the first module on a first substrate of the first module to define a marginal region of the touch panel;
      forming a first high density conductive layer of the first module by a HiPIMS-assisted-DC sputtering process, wherein the first high density conductive layer is formed on the first substrate and covers the mask layer; and
      forming a plurality of first electrodes connected to the first high density conductive layer, wherein the plurality of first electrodes are located in the marginal region of the touch panel and shielded by the mask layer;
    forming a second module of the touch panel, comprising:
      forming a second high density conductive layer of the second module by the HiPIMS-assisted-DC sputtering process, wherein the second high density conductive layer is formed on a second substrate; and
      forming a plurality of second electrodes connected to the second high density conductive layer, wherein the plurality of second electrodes are located in the marginal region of the touch panel and shielded by the mask layer; and
    bonding the first module with the second module.

14. The method of claim 13, wherein bonding the first module with the second module comprises bonding the first module and the second module by a transparent adhesive layer.

15. The method of claim 13, wherein:
    a material of the first high density conductive layer and a material of the second high density conductive layer comprise indium tin oxide (ITO), and
    while forming the first high density conductive layer of the first module by the HiPIMS-assisted-DC sputtering process and forming the second high density conductive layer of the second module by the HiPIMS-assisted-DC sputtering process:
      a power impulse interval of the HiPIMS-assisted-DC sputtering process is between 350 µs and 1500 µs,
      a sputtering voltage of the HiPIMS-assisted-DC sputtering process is between 450V and 1000V,
      a sputtering power of the HiPIMS-assisted-DC sputtering process is between 5 kW and 10 kW,
      a time of a power impulse of the HiPIMS-assisted-DC sputtering process is 10 µs to 200 µs,
      a gas flow rate of the HiPIMS-assisted-DC sputtering process is between 500 sccms and 1500 sccms,
      a pressure of the HiPIMS-assisted-DC sputtering process is between 0.002 Torr and 0.010 Torr, and
      a temperature of the first substrate and a temperature of the second substrate are set as 230 degree centigrade.

16. The method of claim 13, comprising curing the mask layer by an ionizing radiation process.

17. The method of claim 13, comprising:
    patterning the first high density conductive layer; and
    patterning the second high density conductive layer.

18. The method of claim 13, wherein forming the first module and the second module are performed simultaneously.

* * * * *